United States Patent
Xue

(10) Patent No.: US 10,181,716 B2
(45) Date of Patent: Jan. 15, 2019

(54) HOT-SWAP PROTECTION CIRCUIT

(71) Applicant: Capital Microelectronics Co., Ltd., Beijing (CN)

(72) Inventor: Qinghua Xue, Beijing (CN)

(73) Assignee: CAPITAL MICROELECTRONICS CO., LTD., Beijing (CN)

(*) Notice: Subject to any disclaimer, the term of this patent is extended or adjusted under 35 U.S.C. 154(b) by 382 days.

(21) Appl. No.: 14/902,215

(22) PCT Filed: Jul. 31, 2015

(86) PCT No.: PCT/CN2015/085731
§ 371 (c)(1),
(2) Date: Dec. 30, 2015

(87) PCT Pub. No.: WO2017/020169
PCT Pub. Date: Feb. 9, 2017

(65) Prior Publication Data
US 2017/0170650 A1    Jun. 15, 2017

(51) Int. Cl.
*H02H 7/20* (2006.01)
(52) U.S. Cl.
CPC .................... *H02H 7/20* (2013.01)
(58) Field of Classification Search
CPC ........................................... H02H 7/20
USPC .......................................... 361/90
See application file for complete search history.

(56) References Cited

FOREIGN PATENT DOCUMENTS

CN        203312782 U   *  11/2013

OTHER PUBLICATIONS

Machine translation of Jin et al. Chinese Patent Document CN 203312782 U, Nov. 2013.*

* cited by examiner

*Primary Examiner* — Kevin J Comber
(74) *Attorney, Agent, or Firm* — Buchanan Ingersoll & Rooney, PC

(57) ABSTRACT

A hot-swap protection circuit includes: a hot-swap circuit, a hot-swap detection circuit, and an N-well generation circuit, where the hot-swap detection circuit is configured to detect whether hot-swap is performed on the hot-swap circuit, and feed back a detection result to the N-well generation circuit; and the N-well generation circuit is configured to receive the detection result fed back by the hot-swap detection circuit, and output a control signal according to the detection result, to protect the hot-swap circuit. The hot-swap detection circuit is used to detect whether hot-swap is performed on the hot-swap circuit, and the detection result is fed back to the N-well generation circuit, so that the N-well generation circuit outputs a control signal according to the detection result fed back by the hot-swap detection circuit, to protect the hot-swap circuit, thereby preventing the hot-swap of the hot-swap circuit from burning a host or a peripheral device.

8 Claims, 4 Drawing Sheets

HOT-SWAP PROTECTION CIRCUIT

BACKGROUND

Technical Field

The present invention relates to the field of hot-swap technologies, and in particular, to a hot-swap protection circuit.

Related Art

Hot-swap, that is, hot-plug, refers to inserting or removing a peripheral device supporting hot-swap without shutting down a system or powering off, a host or the peripheral device will not be burnt, and a new device can be detected and used in real time.

However, when a power supply is not powered on normally, and a pad terminal of a hot-swap circuit already has a signal or voltage, the signal or voltage at the pad terminal will be conducted to the power supply, and if hot-swap is performed in this case, the host or peripheral device will be burnt.

SUMMARY

An objective of the present invention is to provide a hot-swap protection circuit, in which a hot-swap detection circuit is used to detect whether hot-swap is performed on a hot-swap circuit, and a detection result is fed back to an N-well generation circuit, so that the N-well generation circuit outputs a control signal according to the detection result fed back by the hot-swap detection circuit, to protect the hot-swap circuit, thereby preventing the hot-swap of the hot-swap circuit from burning a host or a peripheral device.

To achieve the above objective, the present invention provides a hot-swap protection circuit, the circuit includes: a hot-swap circuit, a hot-swap detection circuit, and an N-well generation circuit, where the hot-swap detection circuit is configured to detect whether hot-swap is performed on the hot-swap circuit, and feed back a detection result to the N-well generation circuit; and the N-well generation circuit is configured to receive the detection result fed back by the hot-swap detection circuit, and output a control signal according to the detection result, to protect the hot-swap circuit.

Preferably, the hot-swap detection circuit is specifically configured to:

detect whether a level at a pad terminal of the hot-swap circuit is a high level, at the same time, detect whether a power supply terminal of the hot-swap circuit is of a low level, and when the hot-swap detection circuit detects that the level at the pad terminal is a high level and the power supply terminal is of a low level, feed back to the N-well generation circuit the detection result that hot-swap is performed on the hot-swap circuit.

Preferably, when the hot-swap circuit is a low-voltage differential signal (LVDS) circuit, the hot-swap detection circuit includes a first hot-swap detection circuit and a second hot-swap detection circuit, where the first hot-swap detection circuit is configured to detect whether a level at a first pad terminal of a first hot-swap circuit in the LVDS circuit is a high level, at the same time, detect whether a power supply terminal of the first hot-swap circuit is of a low level, and feedback a first detection result to the N-well generation circuit;

the second hot-swap detection circuit is configured to detect whether a level at a second pad terminal of a second hot-swap circuit in the LVDS circuit is a high level, at the same time, detect whether a power supply terminal of the second hot-swap circuit is of a low level, and feedback a second detection result to the N-well generation circuit; and the N-well generation circuit is configured to receive the first detection result and the second detection result, and output a control signal according to the first detection result and the second detection result, to protect the LVDS circuit.

Further preferably, when the first hot-swap detection circuit detects that the level at the first pad terminal is a high level and the power supply terminal of the first hot-swap circuit is of a low level, and the second hot-swap detection circuit detects that the level at the second pad terminal is a low level, the first detection result that hot-swap is performed on the first hot-swap circuit and the second detection result that hot-swap is not performed on the second hot-swap circuit are fed back to the N-well generation circuit; and the N-well generation circuit is configured to receive the first detection result and the second detection result, and output a first control signal according to the first detection result and the second detection result, to protect the first hot-swap circuit.

Further preferably, when the first hot-swap detection circuit detects that the level at the first pad terminal is a low level, and the second hot-swap detection circuit detects that the level at the second pad terminal is a high level and the power supply terminal of the second hot-swap circuit is of a low level, the first detection result that hot-swap is not performed on the first hot-swap circuit and the second detection result that hot-swap is performed on the second hot-swap circuit are fed back to the N-well generation circuit; and the N-well generation circuit is configured to receive the first detection result and the second detection result, and output a second control signal according to the first detection result and the second detection result, to protect the second hot-swap circuit.

Further preferably, when the first hot-swap detection circuit detects that the level at the first pad terminal is a high level and the power supply terminal of the first hot-swap circuit is of a low level, and the second hot-swap detection circuit detects that the level at the second pad terminal is a high level and the power supply terminal of the second hot-swap circuit is of a low level, the first detection result that hot-swap is performed on the first hot-swap circuit and the second detection result that hot-swap is performed on the second hot-swap circuit are fed back to the N-well generation circuit; and the N-well generation circuit is configured to receive the first detection result and the second detection result, and output a third control signal according to the first detection result and the second detection result, to protect one of the first hot-swap circuit and the second hot-swap circuit.

Further preferably, when the level at the first pad terminal is higher than the level at the second pad terminal, the N-well generation circuit is specifically configured to: output the third control signal according to the first detection result and the second detection result, to protect the first hot-swap circuit.

Further preferably, when the level at the second pad terminal is higher than the level at the first pad terminal, the N-well generation circuit is specifically configured to: output the third control signal according to the first detection result and the second detection result, to protect the second hot-swap circuit.

Further preferably, when the first hot-swap detection circuit detects that the level at the first pad terminal is a low level, and the second hot-swap detection circuit detects that the level at the second pad terminal is a low level, the first detection result that hot-swap is not performed on the first hot-swap circuit and the second detection result that hot-swap is not performed on the second hot-swap circuit are fed back to the N-well generation circuit; and the N-well generation circuit is configured to receive the first detection result and the second detection result, and output a third control signal according to the first detection result and the second detection result to switch the higher voltage of power and Pad signal to N-well.

Based on the above technical solution, in a hot-swap protection circuit provided in embodiments of the present invention, a hot-swap detection circuit is used to detect whether hot-swap is performed on a hot-swap circuit, and a detection result is fed back to an N-well generation circuit, so that the N-well generation circuit outputs a control signal according to the detection result fed back by the hot-swap detection circuit, to protect the hot-swap circuit, thereby preventing the hot-swap of the hot-swap circuit from burning a host or a peripheral device.

BRIEF DESCRIPTION OF THE DRAWINGS

To describe the technical solutions of the embodiments of the present invention more clearly, the following briefly introduces the accompanying drawings required for describing the embodiments of the present invention. Apparently, the accompanying drawings in the following description show only some embodiments of the present invention, and a person of ordinary skill in the art may still derive other drawings from these accompanying drawings without creative efforts.

DETAILED DESCRIPTION

The following clearly and completely describes the technical solutions in the embodiments of the present invention with reference to the accompanying drawings in the embodiments of the present invention. Apparently, the described embodiments are some of the embodiments of the present invention rather than all of the embodiments. All other embodiments obtained by a person of ordinary skill in the art based on the embodiments of the present invention without creative efforts shall fall within the protection scope of the present invention.

Figure 1:
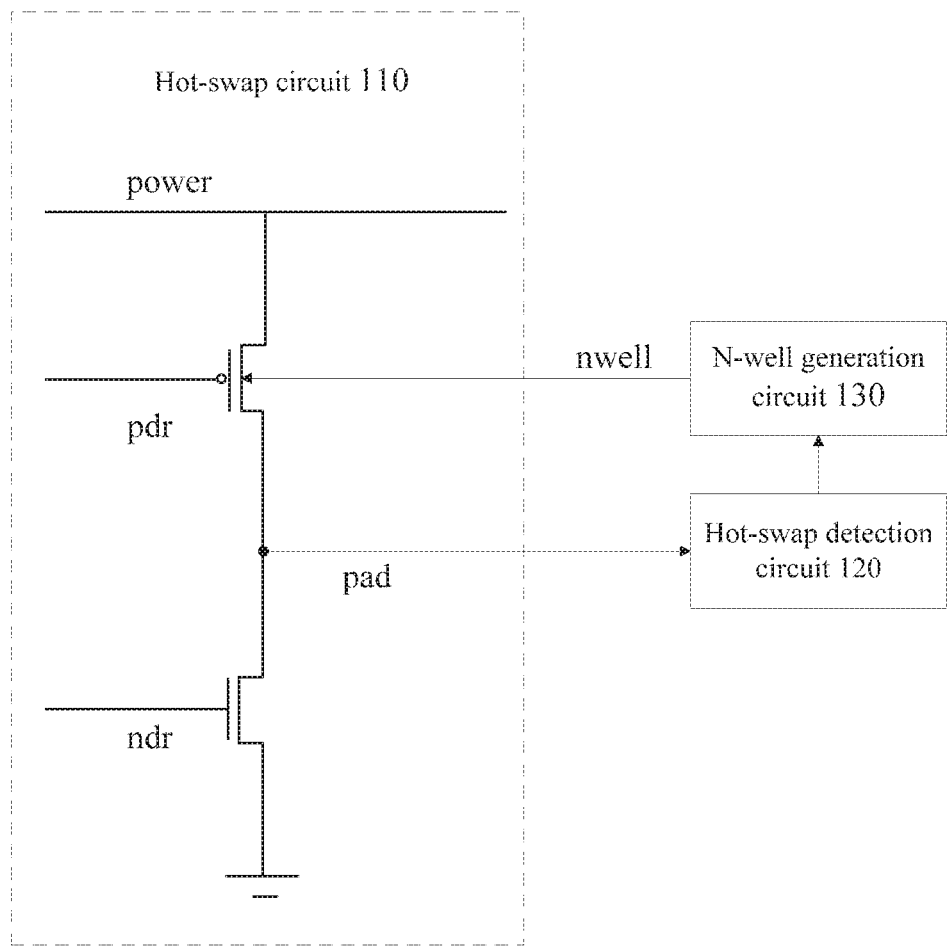
FIG. 1 is a schematic structural diagram of a hot-swap protection circuit provided according to an embodiment of the present invention.

FIG. 1 is a schematic structural diagram of a hot-swap protection circuit 100 provided according to an embodiment of the present invention. The hot-swap protection circuit 100 shown in FIG. 1 includes: a hot-swap circuit 110, a hot-swap detection circuit 120, and an N-well generation circuit 130, where the hot-swap detection circuit 120 is configured to detect whether hot-swap is performed on the hot-swap circuit 110, and feed back a detection result to the N-well generation circuit 130, and the N-well generation circuit 130 is configured to receive the detection result fed back by the hot-swap detection circuit 120, and output a control signal according to the detection result, to protect the hot-swap circuit 110.

Specifically, in the embodiment of the present invention, the hot-swap detection circuit 120 may determine, by detecting a level at a pad terminal of the hot-swap circuit 110, whether hot-swap is performed on the hot-swap circuit 110; when determining that hot-swap is performed on the hot-swap circuit 110, the hot-swap detection circuit 120 feeds back to the N-well generation circuit 130 a detection result that hot-swap is performed on the hot-swap circuit 110, and the N-well generation circuit 130 receives the detection result and outputs the N-well volgate nwell according to the detection result, to protect the hot-swap circuit 110; when determining that hot-swap is not performed on the hot-swap circuit 110, the hot-swap detection circuit 120 feeds back to the N-well generation circuit 130 a detection result that hot-swap is not performed on the hot-swap circuit 110, and the N-well generation circuit 130 receives the detection result and outputs the N-well voltage nwell according to the detection result, to switch on a power supply power of the hot-swap circuit 110.

Therefore, in a hot-swap protection circuit provided according to the embodiment of the present invention, the hot-swap detection circuit is used to detect whether hot-swap is performed on the hot-swap circuit, and the detection result is fed back to the N-well generation circuit, so that the N-well generation circuit outputs the control signal according to the detection result fed back by the hot-swap detection circuit, to protect the hot-swap circuit, thereby preventing the hot-swap of the hot-swap circuit from burning a host or a peripheral device.

Preferably, as an embodiment of the present invention, the hot-swap detection circuit 120 is specifically configured to:

detect whether a level at a pad terminal of the hot-swap circuit 110 is a high level, at the same time, detect whether a power supply terminal of the hot-swap circuit 110 is of a low level; and when the hot-swap detection circuit 120 detects that the level at the pad terminal is a high level and the power supply terminal is of a low level, feed back to the N-well generation circuit 130 the detection result that hot-swap is performed on the hot-swap circuit 110, so that the N-well generation circuit 130 outputs a control signal according to the detection result, to protect the hot-swap circuit 110.

Figure 2:
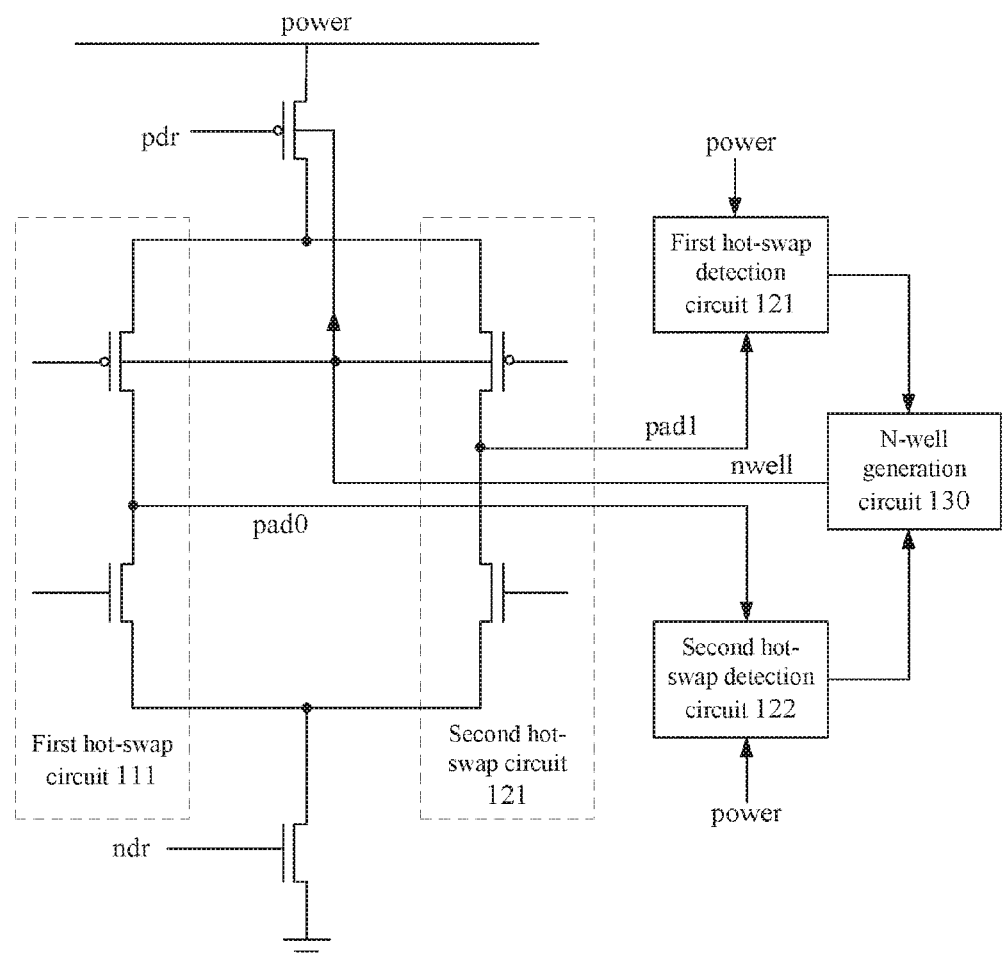
FIG. 2 is a schematic structural diagram of a hot-swap protection circuit provided according to another embodiment of the present invention.

Further preferably, as another embodiment of the present invention, as shown in FIG. 2, when the hot-swap circuit is a Low-Voltage Differential Signaling (LVDS) circuit, the LVDS circuit includes 2 IOs, and therefore, the hot-swap detection circuit includes a first hot-swap detection circuit 121 and a second hot-swap detection circuit 122, where the first hot-swap detection circuit 121 is configured to detect whether a level at a first pad terminal of a first hot-swap circuit 111 in the LVDS circuit is a high level, at the same time, detect whether a power supply terminal of the first hot-swap circuit 111 is of a low level, and feedback a first detection result to the N-well generation circuit 130;

the second hot-swap detection circuit 122 is configured to detect whether a level at a second pad terminal of a second hot-swap circuit 112 in the LVDS circuit is a high level, at the same time, detect whether a power supply terminal of the second hot-swap circuit 112 is of a low level, and feedback a second detection result to the N-well generation circuit 130; and the N-well generation circuit 130 is configured to receive the first detection result of the first hot-swap circuit 111 and the second detection result of the second hot-swap circuit 112, and output a control signal according to the first detection result and the second detection result, to protect the LVDS circuit.

Specifically, in the embodiment of the present invention, the first hot-swap detection circuit 121 is configured to detect whether a level at a pad0 terminal of the first hot-swap circuit 111 is a high level, at the same time, detect whether a power supply terminal power of the first hot-swap circuit 111 is of a low level, and feedback a detection result to the N-well generation circuit 130; the second hot-swap detection circuit 122 is configured to detect whether a level at a pad1 terminal of the second hot-swap circuit 112 is a high level, at the same time, detect whether a power supply terminal power of the second hot-swap circuit 112 is of a low level, and feedback a detection result to the N-well generation circuit 130, and the N-well generation circuit 130 receives the detection results and outputs the N-well voltage nwell according to the detection results, to protect the LVDS circuit.

Therefore, in a hot-swap protection circuit provided according to the embodiment of the present invention, the hot-swap detection circuit is used to detect whether hot-swap is performed on the hot-swap circuit, and the detection result is fed back to the N-well generation circuit, so that the N-well generation circuit outputs the control signal according to the detection result fed back by the hot-swap detection circuit, to protect the hot-swap circuit, thereby preventing the hot-swap of the hot-swap circuit from burning a host or a peripheral device.

Figure 3:
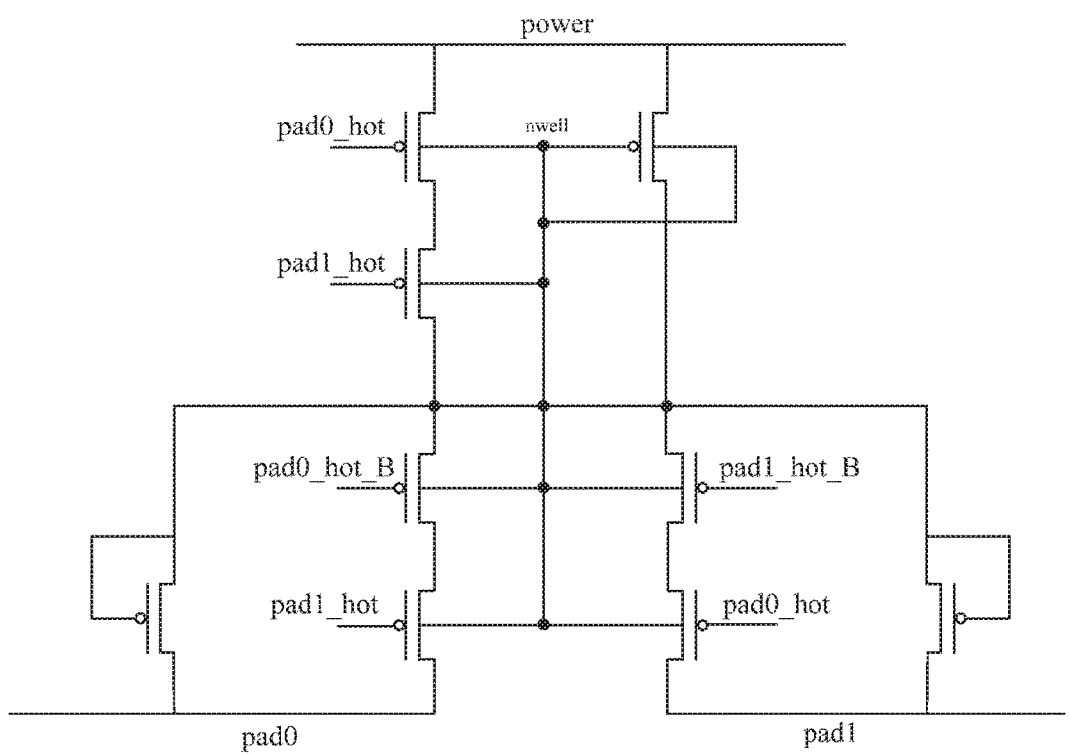
FIG. 3 is a schematic structural diagram of an N-well generation circuit included in a hot-swap protection circuit provided according to an embodiment of the present invention.
Figure 4:
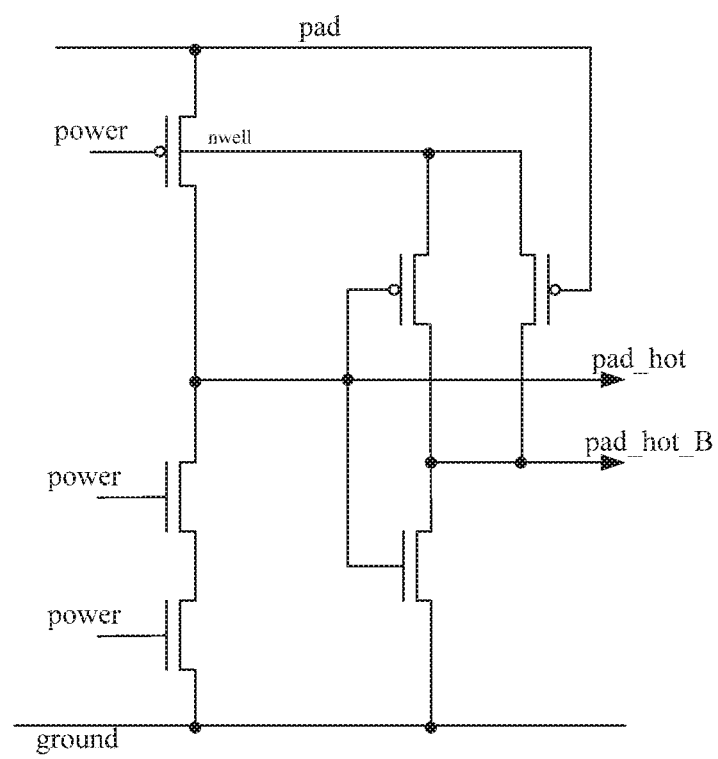
FIG. 4 is a schematic structural diagram of a hot-swap detection circuit included in a hot-swap protection circuit provided according to an embodiment of the present invention.

It should be noted that, in the embodiment of the present invention, a schematic structural diagram of the N-well generation circuit 130 may be as that shown in FIG. 3.

Specifically, in the embodiment of the present invention, when the first hot-swap detection circuit 121 detects that a level at the first pad terminal is a high level and a power supply terminal power of the first hot-swap circuit 111 is of a low level; and the second hot-swap detection circuit 122 detects that a level at the second pad terminal is a low level, the first detection result that hot-swap is performed on the first hot-swap circuit 111 and the second detection result that hot-swap is not performed on the second hot-swap circuit 112 are fed back to the N-well generation circuit 130; and the N-well generation circuit 130 is configured to receive the first detection result and the second detection result, and output a first control signal according to the first detection result and the second detection result, to protect the first hot-swap circuit 111.

In other words, when the first hot-swap detection circuit 121 detects that a level at the first pad terminal is a high level and a power supply terminal power of the first hot-swap circuit 111 is of a low level, an output of a pad0_hot terminal shown in FIG. 3 is 1, and in contrast, an output of a pad0_hot_B terminal is 0, it may indicate that hot-swap is performed on the first hot-swap circuit 111. Likewise, when the second hot-swap detection circuit 122 detects that a level at the second pad terminal is a low level, an output of a pad1_hot terminal shown in FIG. 3 is 0, and in contrast, an output of a pad1_hot_B terminal is 1, it may indicate that hot-swap is not performed on the first hot-swap circuit 111, and the N-well generation circuit 130 may determine and output a control signal according to the detection results fed back by the first hot-swap detection circuit 121 and the second hot-swap detection circuit 122, to protect the first hot-swap circuit 111.

When the first hot-swap detection circuit 121 detects that a level at the first pad terminal is a low level, and the second hot-swap detection circuit 122 detects that a level at the second pad terminal is a high level and a power supply terminal power of the second hot-swap circuit 112 is of a low level, the first detection result that hot-swap is not performed on the first hot-swap circuit 111 and the second detection result that hot-swap is performed on the second hot-swap circuit 112 are fed back to the N-well generation circuit 130; and the N-well generation circuit 130 is configured to receive the first detection result and the second detection result, and output a second control signal according to the first detection result and the second detection result, to protect the second hot-swap circuit 112.

In other words, when the first hot-swap detection circuit 121 detects that a level at the first pad terminal is a low level, an output of a pad0_hot terminal shown in FIG. 3 is 0, and in contrast, an output of a pad0_hot_B terminal is 1, it may indicate that hot-swap is not performed on the first hot-swap circuit 111. Likewise, when the second hot-swap detection circuit 122 detects that a level at the second pad terminal is a high level and a power supply terminal power of the second hot-swap circuit 112 is of a low level, an output of a pad1_hot terminal shown in FIG. 3 is 1, and in contrast, an output of a pad1_hot_B terminal is 0, it may indicate that hot-swap is performed on the second hot-swap circuit 112, and the N-well generation circuit 130 may determine and output a control signal according to the detection results fed back by the first hot-swap detection circuit 121 and the second hot-swap detection circuit 122, to protect the second hot-swap circuit 112.

When the first hot-swap detection circuit detects that a level at the first pad terminal is a low level, and the second hot-swap detection circuit detects that a level at the second pad terminal is a low level, the first detection result that hot-swap is not performed on the first hot-swap circuit and the second detection result that hot-swap is not performed on the second hot-swap circuit are fed back to the N-well generation circuit; and the N-well generation circuit is configured to receive the first detection result and the second detection result, and output a fourth control signal according to the first detection result and the second detection result, to switch on a power supply of the hot-swap circuit.

In other words, when the first hot-swap detection circuit 121 detects that a level at the first pad terminal is a low level, an output of a pad0_hot terminal shown in FIG. 3 is 0, and in contrast, an output of a pad0_hot_B terminal is 1, it may indicate that hot-swap is not performed on the first hot-swap circuit 111. Likewise, when the second hot-swap detection circuit 122 detects that a level at the second pad terminal is a low level, an output of a pad1_hot terminal shown in FIG. 3 is 0, and in contrast, an output of a pad1_hot_B terminal is 1, it may indicate that hot-swap is not performed on the second hot-swap circuit 112, and the N-well generation circuit 130 may determine and output a control signal according to the detection results fed back by the first hot-swap detection circuit 121 and the second hot-swap detection circuit 122, to switch on the power supply power of the hot-swap circuit 110.

When the first hot-swap detection circuit detects that the level at the first pad terminal is a high level and the power supply terminal of the first hot-swap circuit 111 is of a low level, and the second hot-swap detection circuit detects that the level at the second pad terminal is a high level and the power supply terminal of the second hot-swap circuit 112 is of a low level, the first detection result that hot-swap is performed on the first hot-swap circuit and the second detection result that hot-swap is performed on the second hot-swap circuit are fed back to the N-well generation circuit; and the N-well generation circuit is configured to receive the first detection result and the second detection result, and output a third control signal according to the first detection result and the second detection result, to protect one of the first hot-swap circuit and the second hot-swap circuit.

In other words, when the first hot-swap detection circuit 121 detects that a level at the first pad terminal is a high level and a power supply terminal power of the first hot-swap circuit 111 is of a low level, an output of a pad0_hot terminal shown in FIG. 3 is 1, and in contrast, an output of a pad0_hot_B terminal is 0, it may indicate that hot-swap is performed on the first hot-swap circuit 111. Likewise, when the second hot-swap detection circuit 122 detects that a level at the second pad terminal is a high level and a power supply terminal power of the second hot-swap circuit 112 is of a low level, an output of a pad1_hot terminal shown in FIG. 3 is 1, and in contrast, an output of a pad1_hot_B terminal is 0, it may indicate that hot-swap is performed on the second hot-swap circuit 112, and the N-well generation circuit 130 may determine and output, according to the detection results fed back by the first hot-swap detection circuit 121 and the second hot-swap detection circuit 122, a control signal used for protecting the first hot-swap circuit 111 or a control used for protecting the second hot-swap circuit 112.

Further preferably, in the embodiment of the present invention, when the level at the first pad terminal is higher than the level at the second pad terminal, the N-well generation circuit 130 is specifically configured to: output the third control signal according to the first detection result and the second detection result, to protect the first hot-swap circuit. When the level at the second pad terminal is higher than the level at the first pad terminal, the N-well generation circuit 130 is specifically configured to: output the third control signal according to the first detection result and the second detection result, to protect the second hot-swap circuit.

In other words, in the embodiment of the present invention, when the level at the first pad terminal is higher than the level at the second pad terminal, the control signal output by the N-well generation circuit 130 is used to protect the first hot-swap circuit 111; and when the level at the second pad terminal is higher than the level at the first pad terminal, the control signal output by the N-well generation circuit 130 is used to protect the second hot-swap circuit 112.

Therefore, in a hot-swap protection circuit provided according to the embodiment of the present invention, the hot-swap detection circuit is used to detect whether hot-swap is performed on the hot-swap circuit, and the detection result is fed back to the N-well generation circuit, so that the N-well generation circuit outputs the control signal according to the detection result fed back by the hot-swap detection circuit, to protect the hot-swap circuit, thereby preventing the hot-swap of the hot-swap circuit from burning a host or a peripheral device.

A person skilled in the art may further aware that, units of various examples described in combination with the embodiments disclosed in the text may be implemented by using electronic hardware, computer software, or a combination of the two. The specific implementation manners described above provides further detailed descriptions on objectives, technical solutions and beneficial effects of the present invention. Therefore, it should be understood that, the above descriptions are merely specific implementation manners, and are not intended to limit the protection scope of the present invention. Any modification, equivalent replacement and improvement made without departing from the spirit and principle of the present invention shall fall within the protection scope of the present invention.

What is claimed is:

1. A hot-swap protection circuit, comprising: a hot-swap circuit, a hot-swap detection circuit, and an N-well generation circuit, wherein
   the hot-swap detection circuit is configured to detect whether hot-swap is performed on the hot-swap circuit, and feed back a detection result to the N-well generation circuit; and
   the N-well generation circuit is configured to receive the detection result fed back by the hot-swap detection circuit, and output a control signal according to the detection result, to protect the hot-swap circuit,
   wherein when the hot-swap circuit is a low-voltage differential signal (LVDS) circuit, the hot-swap detection circuit comprises a first hot-swap detection circuit and a second hot-swap detection circuit, wherein
      the first hot-swap detection circuit is configured to detect whether a level at a first pad terminal of a first hot-swap circuit in the LVDS circuit is a high level, at the same time, detect whether a power supply terminal of the first hot-swap circuit is of a low level, and feedback a first detection result to the N-well generation circuit;
      the second hot-swap detection circuit is configured to detect whether a level at a second pad terminal of a second hot-swap circuit in the LVDS circuit is a high level, at the same time, detect whether a power supply terminal of the second hot-swap circuit is of a low level, and feedback a second detection result to the N-well generation circuit; and
      the N-well generation circuit is configured to receive the first detection result and the second detection result, and output a control signal according to the first detection result and the second detection result, to protect the LVDS circuit.

2. The hot-swap protection circuit according to claim 1, wherein the hot-swap detection circuit is specifically configured to:
   detect whether a level at a pad terminal of the hot-swap circuit is a high level, at the same time, detect whether a power supply terminal of the hot-swap circuit is of a low level, and when the hot-swap detection circuit detects that the level at the pad terminal is a high level and the power supply terminal is of a low level, feed back to the N-well generation circuit the detection result that hot-swap is performed on the hot-swap circuit.

3. The hot-swap protection circuit according to claim 1, wherein, when the first hot-swap detection circuit detects that the level at the first pad terminal is a high level and the power supply terminal of the first hot-swap circuit is of a low level, and the second hot-swap detection circuit detects that the level at the second pad terminal is a low level, the first detection result that hot-swap is performed on the first hot-swap circuit and the second detection result that hot-swap is not performed on the second hot-swap circuit are fed back to the N-well generation circuit; and
   the N-well generation circuit is configured to receive the first detection result and the second detection result, and output a first control signal according to the first detection result and the second detection result, to protect the first hot-swap circuit.

4. The hot-swap protection circuit according to claim 1, wherein, when the first hot-swap detection circuit detects that the level at the first pad terminal is a low level, and the second hot-swap detection circuit detects that the level at the second pad terminal is a high level and the power supply terminal of the second hot-swap circuit is of a low level, the first detection result that hot-swap is not performed on the first hot-swap circuit and the second detection result that hot-swap is performed on the second hot-swap circuit are fed back to the N-well generation circuit; and the N-well generation circuit is configured to receive the first detection result and the second detection result, and output a second control signal according to the first detection result and the second detection result, to protect the second hot-swap circuit.

5. The hot-swap protection circuit according to claim 1, wherein, when the first hot-swap detection circuit detects that the level at the first pad terminal is a high level and the power supply terminal of the first hot-swap circuit is of a low level, and the second hot-swap detection circuit detects that the level at the second pad terminal is a high level and the power supply terminal of the second hot-swap circuit is of a low level, the first detection result that hot-swap is performed on the first hot-swap circuit and the second detection result that hot-swap is performed on the second hot-swap circuit are fed back to the N-well generation circuit; and the N-well generation circuit is configured to receive the first detection result and the second detection result, and output a third control signal according to the first detection result and the second detection result, to protect one of the first hot-swap circuit and the second hot-swap circuit.

6. The hot-swap protection circuit according to claim 5, wherein when the level at the first pad terminal is higher than the level at the second pad terminal, the N-well generation circuit is specifically configured to: output the third control signal according to the first detection result and the second detection result, to protect the first hot-swap circuit.

7. The hot-swap protection circuit according to claim 5, wherein when the level at the second pad terminal is higher than the level at the first pad terminal, the N-well generation circuit is specifically configured to: output the third control signal according to the first detection result and the second detection result, to protect the second hot-swap circuit.

8. The hot-swap protection circuit according to claim 1, wherein, when the first hot-swap detection circuit detects that the level at the first pad terminal is a low level, and the second hot-swap detection circuit detects that the level at the second pad terminal is a low level, the first detection result that hot-swap is not performed on the first hot-swap circuit and the second detection result that hot-swap is not performed on the second hot-swap circuit are fed back to the N-well generation circuit; and the N-well generation circuit is configured to receive the first detection result and the second detection result, and output a fourth control signal according to the first detection result and the second detection result, to switch on a power supply of the hot-swap circuit.

* * * * *